US010866565B2

(12) United States Patent
Di Domenico et al.

(10) Patent No.: US 10,866,565 B2
(45) Date of Patent: Dec. 15, 2020

(54) TIMEPIECE OSCILLATOR WITH FLEXURE BEARINGS HAVING A LONG ANGULAR STROKE

(71) Applicant: The Swatch Group Research and Development Ltd, Marin (CH)

(72) Inventors: Gianni Di Domenico, Neuchatel (CH); Dominique Lechot, Les Reussilles (CH); Jerome Favre, Neuchatel (CH); Baptiste Hinaux, Lausanne (CH); Jean-Jacques Born, Morges (CH); Jean-Luc Helfer, Le Landeron (CH); Pascal Winkler, St-Blaise (CH)

(73) Assignee: The Swatch Group Research and Development Ltd, Marin (CH)

( * ) Notice: Subject to any disclaimer, the term of this patent is extended or adjusted under 35 U.S.C. 154(b) by 270 days.

(21) Appl. No.: 16/047,250

(22) Filed: Jul. 27, 2018

(65) Prior Publication Data

US 2019/0033784 A1    Jan. 31, 2019

(30) Foreign Application Priority Data

Jul. 28, 2017   (EP) .................................... 17183666

(51) Int. Cl.
  *G04B 17/04*   (2006.01)
  *G04B 17/28*   (2006.01)
(52) U.S. Cl.
  CPC ........... *G04B 17/04* (2013.01); *G04B 17/045* (2013.01); *G04B 17/28* (2013.01)
(58) Field of Classification Search
  CPC ...... G04B 17/04; G04B 17/045; G04B 17/28; G04B 17/30; G04B 15/14; G04B 31/00;
  (Continued)

(56) References Cited

U.S. PATENT DOCUMENTS 3,269,106 A * 8/1966 Waldburger ........... G04C 3/102
                                                    368/168
3,528,308 A * 9/1970 Favre ..................... G04B 17/04
                                                     74/142

(Continued)

FOREIGN PATENT DOCUMENTS

CH        709 536 A2    10/2015
EP      3 035 127 A1     6/2016
(Continued)

OTHER PUBLICATIONS

European Search Report dated Jan. 23, 2018 in European Application 17183666.1 filed on Jul. 28, 2017 (with English Translation of Categories of Cited Documents).

(Continued)

*Primary Examiner* — Edwin A. Leon
(74) *Attorney, Agent, or Firm* — Oblon, McClelland, Maier & Neustadt, L.L.P.

(57) ABSTRACT

A mechanical timepiece oscillator includes, between a first element and a second inertial element, two distinct flexible strips returning the inertial element to a rest position in an oscillation plane, the projections of these strips crossing each other, in the rest position, at a point, through which passes the pivoting axis of the second solid inertial element, the embedding points of the strips in the first element and the second inertial element defining two directions in which each strip has a free length between its embedding points, and an axial distance between the pivoting axis and the farthest of its embedding points, and, for each strip, the embedding point ratio is comprised between 0 and 1, and the vertex angle at the crossing point of the directions of the strips is less than 70°.

26 Claims, 3 Drawing Sheets

(58) Field of Classification Search
CPC ...... G04B 17/10; G04B 13/026; G04B 17/32; G04B 31/004; G04B 17/26; G04B 31/02; G04C 3/102; G04C 3/008; G04C 3/101
USPC .......................................................... 368/169
See application file for complete search history.

(56) References Cited

U.S. PATENT DOCUMENTS

| | | | |
|---|---|---|---|
| 3,628,781 A | 12/1971 | Grib | |
| 9,134,705 B2* | 9/2015 | Vardi | G04B 15/08 |
| 9,477,205 B2* | 10/2016 | Born | G04B 17/04 |
| 2015/0248112 A1* | 9/2015 | Stranczl | G04B 15/08 |
| | | | 368/132 |
| 2016/0179058 A1 | 6/2016 | Born et al. | |
| 2017/0045861 A1 | 2/2017 | Winkler et al. | |

FOREIGN PATENT DOCUMENTS

| | | |
|---|---|---|
| EP | 3 130 966 A1 | 2/2017 |
| WO | WO 2017/055983 A1 | 4/2017 |

OTHER PUBLICATIONS

M. H. Kahrobaiyan, et al., "Gravity insensitive flexure pivots for watch oscillators," International Conference on Chronometry, 2016, pp. 49-55.

* cited by examiner

TIMEPIECE OSCILLATOR WITH FLEXURE BEARINGS HAVING A LONG ANGULAR STROKE

This application claims priority from European Patent Application No. 17183666.1 filed on Jul. 28, 2017, the entire disclosure of which is hereby incorporated herein by reference.

FIELD OF THE INVENTION

The invention concerns a mechanical timepiece oscillator comprising a first rigid support element, a second solid inertial element and, between said first rigid support element and said second solid inertial element, at least two first flexible strips which support said second solid inertial element and are arranged to return it to a rest position, wherein said second solid inertial element is arranged to oscillate angularly in an oscillation plane about said rest position, said two first flexible strips do not touch each other and their projections onto said oscillation plane cross, in the rest position, at a crossing point, through which passes the axis of rotation of said second solid inertial element perpendicularly to said oscillation plane, and the embedding of said first flexible strips in said first rigid support element and said second solid inertial element define two strip directions parallel to said oscillation plane and forming between them, in the rest position, in projection onto said oscillation plane, a specific vertex angle α, the position of said crossing point being defined by the ratio X=D/L, where D is the distance between the projection, onto said oscillation plane, of one of the embedding points of said first strips in said first rigid support element and said crossing point, and where L is the total length of the projection, onto said oscillation plane, of said strip where the value of said ratio D/L is comprised between 0 and 1.

The invention also concerns a timepiece movement including at least one such mechanical oscillator.

The invention also concerns a watch including such a timepiece movement.

The invention concerns the field of mechanical oscillators for timepieces comprising flexure guiding members with flexible strips performing the functions of holding and returning movable elements.

BACKGROUND OF THE INVENTION

The use of flexure guiding members, particularly having flexible strips, in mechanical timepiece oscillators, is made possible by processes, such as MEMS, LIGA or similar, for developing micromachinable materials, such as silicon and silicon oxides, which allow for very reproducible fabrication of components which have constant elastic characteristics over time and high insensitivity to external agents such as temperature and moisture. Flexure pivots, such as those disclosed in European Patent Applications EP1419039 or EP16155039 by the same Applicant, can, in particular, replace a conventional balance pivot, and the balance spring usually associated therewith. Removing pivot friction also substantially increases the quality factor of an oscillator. However, flexure pivots generally have a limited angular stroke, of around 10° to 20°, which is very low in comparison to the usual amplitude of 300° of a balance/balance spring, which means they cannot be directly combined with conventional escapement mechanisms, and especially with the usual stopping members such as a Swiss lever or suchlike.

At the International Chronometry Congress in Montreux, Switzerland, on 28 and 29 Sep. 2016, the team of M. H. Kahrobaiyan first addressed the increase in this angular stroke in the article 'Gravity insensitive flexure pivots for watch oscillators', and it appears that the complex solution envisaged is not isochronous.

European Patent Application No. EP3035127A1 in the name of the same Applicant, SWATCH GROUP RESEARCH & DEVELOPMENT Ltd, discloses a timepiece oscillator including at least one tuning fork resonator which includes at least two oscillating moving parts, wherein said moving parts are fixed to a connection element, comprised in said oscillator, by flexible elements whose geometry determines a virtual pivot axis having a determined position with respect to said connection element, said respective mobile part oscillates about said virtual pivot axis and the centre of mass of said moving part coincides in the rest position with said respective virtual pivot axis. For at least one said moving part, said flexible elements are formed of crossed elastic strips extending at a distance from each other in two parallel planes, and whose directions, in projection onto one of said parallel planes, intersect at said virtual pivot axis of the moving part concerned.

U.S. patent application Ser. No. 3628781A in the name of GRIB discloses a tuning fork, in the form of a dual cantilever structure, for causing a pair of movable elements to have accentuated rotational motion, relative to a stationary reference plane comprising a first elastically deformable body having at least two similar elongated elastically bendable portions, the ends of each of said bendable portions being respectively integral with enlarged rigid portions of said element, the first of said rigid portions being fixed to define a reference plane and the second being elastically supported to have accentuated rotational motion relative to the first, a second elastically deformable body substantially identical to the first elastically deformable body, and means for rigidly securing the first of said respective rigid portions of said elastically deformable bodies in spaced relation to provide a tuning fork structure wherein each of the tines of the tuning fork comprises the free end of one of said elastically deformable bodies.

European Patent Application No. EP3130966A1 in the name of ETA Manufacture Horlogere, Switzerland, discloses a mechanical timepiece movement which includes at least one barrel, a set of gear wheels driven at one end by the barrel, and an escapement mechanism of a local oscillator with a resonator in the form of a sprung balance and a feedback system for the timepiece movement. The escapement mechanism is driven at another end of the set of gear wheels. The feedback system includes at least one precise reference oscillator combined with a frequency comparator to compare the frequency of the two oscillators and a mechanism for regulating the local oscillator resonator to slow down or accelerate the resonator based on the result of a comparison in the frequency comparator.

Swiss Patent Application No. CH709536A2 in the name of ETA SA Manufacture Horlogere Suisse discloses a timepiece regulating mechanism which comprises, mounted to move in at least a pivoting motion with respect to a plate, an escape wheel arranged to receive a drive torque via a gear train, and a first oscillator comprising a first rigid structure connected to said plate by first elastic return means. This regulating mechanism includes a second oscillator comprising a second rigid structure, connected to said first rigid structure by second elastic return means, and which includes guiding means arranged to cooperate with complementary guiding means comprised in said escape wheel, synchronizing said first oscillator and said second oscillator with said gear train.

SUMMARY OF THE INVENTION

The invention proposes to develop a mechanical oscillator with flexure guiding members, whose angular stroke is compatible with existing escapement mechanisms.

Considering the particular case of a flexure guiding means with crossed strips in projection onto a plane parallel to the oscillation plane, wherein said strips join a stationary mass and a moving mass, the possible angular stroke θ of the pivot depends on the relation X=D/L between, on the one hand the distance D from the embedding point of a strip in the stationary mass and the crossing point, and on the other hand, the total length L of the same strip between its two opposite embedding points. The aforementioned work of the team of M. H. Kahrobaiyan shows that this possible angular stroke θ, for a given pair of strips with a given vertex angle α at the crossing point, which is 90° here, is maximal where X=D/L=0.5, and decreases rapidly away from this value, in a substantially symmetrical curve. However, such a cross-strip pivot where X=D/L=0.5 and α=90° is not isochronous.

Consequently, the invention explores the fields of advantageous combinations between the values of angle α at the crossing point of the strips, and the values of ratio X=D/L, to obtain isochronous pivots.

To this end, the invention concerns a mechanical oscillator according to claim 1.

In particular, the invention shows that an isochronous oscillator can be obtained with pivots which satisfy two inequalities at the same time:

$$0.15 \leq (X=D/L) \leq 0.85, \text{ and } \alpha \leq 60°.$$

Naturally, configurations where α=0° are excluded, since the strips are no longer secant in projection, but parallel to each other.

The invention also concerns a timepiece movement including at least one such mechanical oscillator.

The invention also concerns a watch including such a timepiece movement.

BRIEF DESCRIPTION OF THE DRAWINGS

Other features and advantages of the invention will appear upon reading the following detailed description, with reference to the annexed drawings, in which.

DETAILED DESCRIPTION OF PREFERRED EMBODIMENTS

Figure 1:
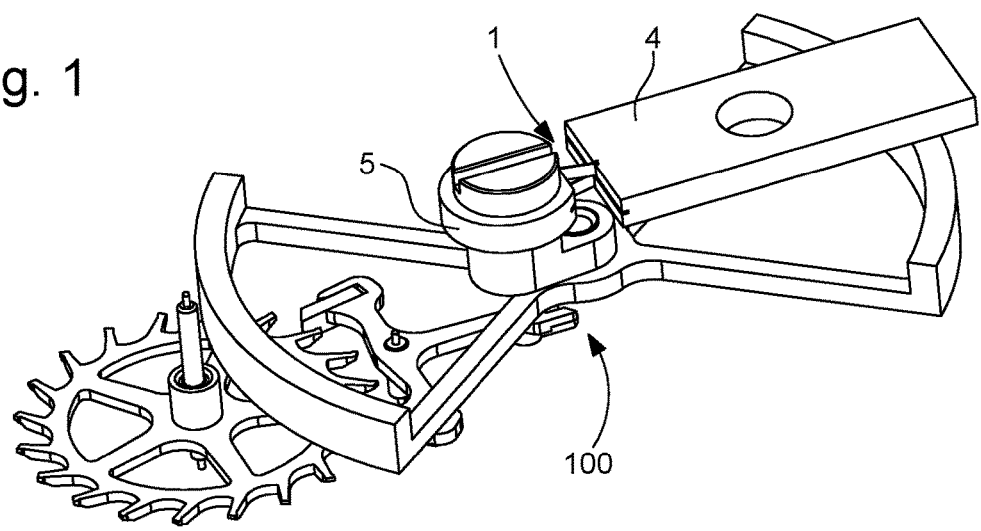
FIG. 1 represents a schematic perspective view of a first variant of a mechanical oscillator, which includes a first rigid support element, of elongated shape, for attachment thereof to a plate of the movement or suchlike, to which is suspended a second solid inertial element by two disjoint flexible strips, crossed in projection onto the oscillation plane of said second solid inertial element, which cooperates with a conventional Swiss lever escapement with a standard escape wheel.

The invention thus concerns a mechanical timepiece oscillator 100, comprising at least a first rigid support element 4 and a second solid inertial element 5. This oscillator 100 includes, between first rigid support element 4 and second solid inertial element 5, at least two first flexible strips 31, 32, which support second solid inertial element 5, and which are arranged to return it to a rest position. This second solid inertial element 5 is arranged to oscillate angularly in an oscillation plane about said rest position.

The first two flexible strips 31 and 32 do not touch each other, and, in the rest position, their projections onto the oscillation plane intersect at a crossing point P, through which passes the axis of rotation of second solid inertial element 5 perpendicularly to the oscillation plane. All the geometric elements described hereinafter should be considered to be in the rest position of the stopped oscillator, unless otherwise stated.

FIGS. 1 to 4 illustrate a first variant with a first rigid support element 4 and a second solid inertial element connected by two first flexible strips 31, 32.

The embedding points of first flexible strips 31, 32 in first rigid support element 4 and second solid inertial element 5 define two strip directions DL1, DL2, which are parallel to the oscillation plane and which form between them, in projection onto the oscillation plane, a vertex angle α.

The position of crossing point P is defined by the ratio X=D/L where D is the distance between the projection, onto the oscillation plane, of one of the embedding points of first strips 31, 32 in first rigid support element 4 and crossing point P, and wherein L is the total length of the projection, onto the oscillation plane, of the strip 31, 32 concerned. And the value of ratio D/L is comprised between 0 and 1, and vertex angle α is less than or equal to 70°.

According to the invention, vertex angle α is less than or equal to 60° and at the same time, for each first flexible strip 31, 32, the embedding ratio D1/L1, D2/L2, is comprised between 0.15 and 0.85 inclusive.

Figure 2:
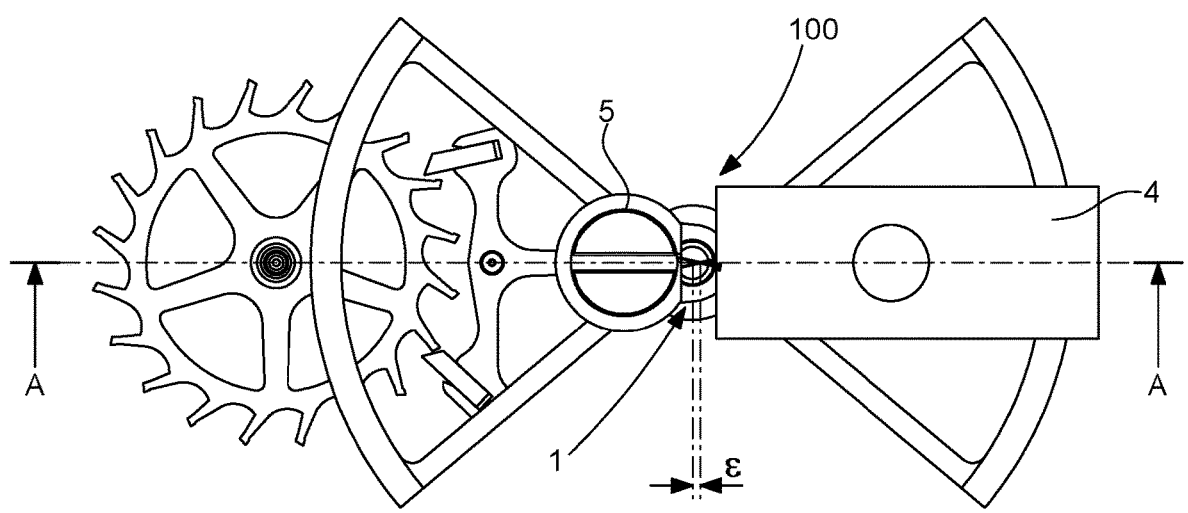
FIG. 2 represents a schematic, perspective view of the oscillator of FIG. 1.
Figure 3:
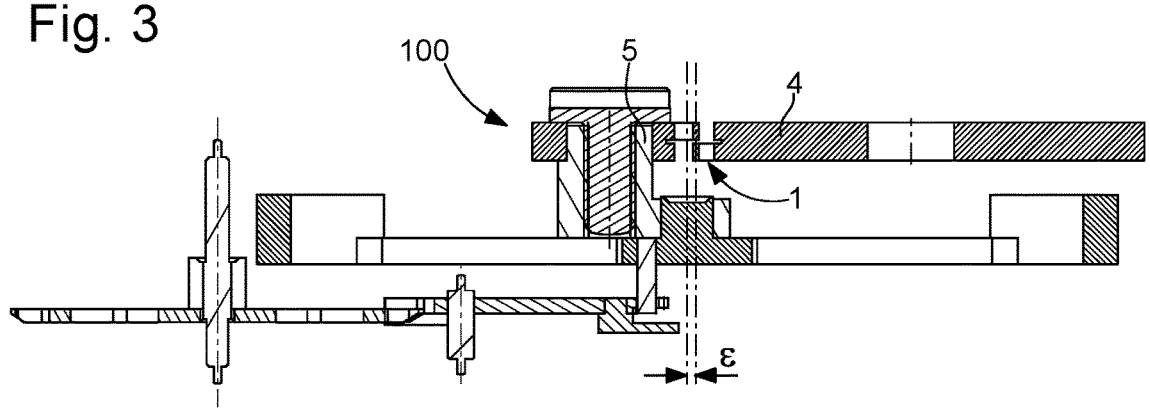
FIG. 3 represents a schematic cross-section through the crossing axis of the strips, of the oscillator of FIG. 1.
Figure 4:
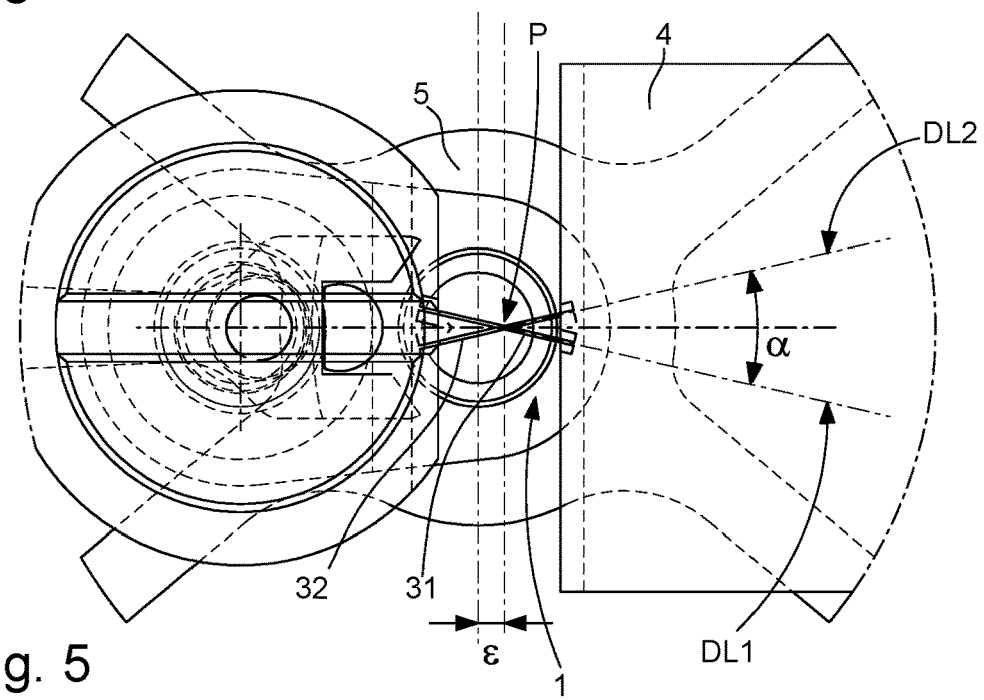
FIG. 4 represents a schematic view of a detail of FIG. 2, showing the offset between the crossing point of the strips and the projection of the centre of mass of the resonator, this detail of the offset being applicable in the same manner to the different variants described hereinafter.

In particular, as seen in FIGS. 2 to 4, the centre of mass of oscillator 100 in its rest position is separated from crossing point P by a distance ε which is comprised between 10% and 20% of the total length L of the projection, onto the oscillation plane, of strip 31, 32. More particularly still, distance ε is comprised between 12% and 18% of the total length L of the projection, onto the oscillation plane, of strip 31, 32.

More particularly, and as illustrated in the Figures, the first strips 31, 32, and their embedding points define together a pivot 1 which, in projection onto the oscillation plane, is symmetrical with respect to an axis of symmetry AA passing through crossing point P.

More particularly, when pivot 1 is symmetrical with respect to axis of symmetry AA, in the rest position, in projection onto the oscillation plane, the centre of mass of second solid inertial element 5 is located on axis of symmetry AA of pivot 1. In projection, this centre of mass may or may not coincide with crossing point P.

More particularly still, the centre of mass of second solid inertial element 5 is located at a non-zero distance from crossing point P corresponding to the axis of rotation of second solid inertial element 5, as seen in FIGS. 2 to 4.

In particular, in projection onto the oscillation plane, the centre of mass of second solid inertial element 5 is located on axis of symmetry AA of pivot 1 and is located at a non-zero distance from crossing point P which is comprised between 0.1 times and 0.2 times the total length L of the projection onto the oscillation plane of strip 31, 32.

More particularly, the first strips 31 and 32 are straight strips.

More particularly still, vertex angle α is less than or equal to 50°, or is less than or equal to 40°, or less than or equal to 35°, or less than or equal to 30°.

Figure 5:
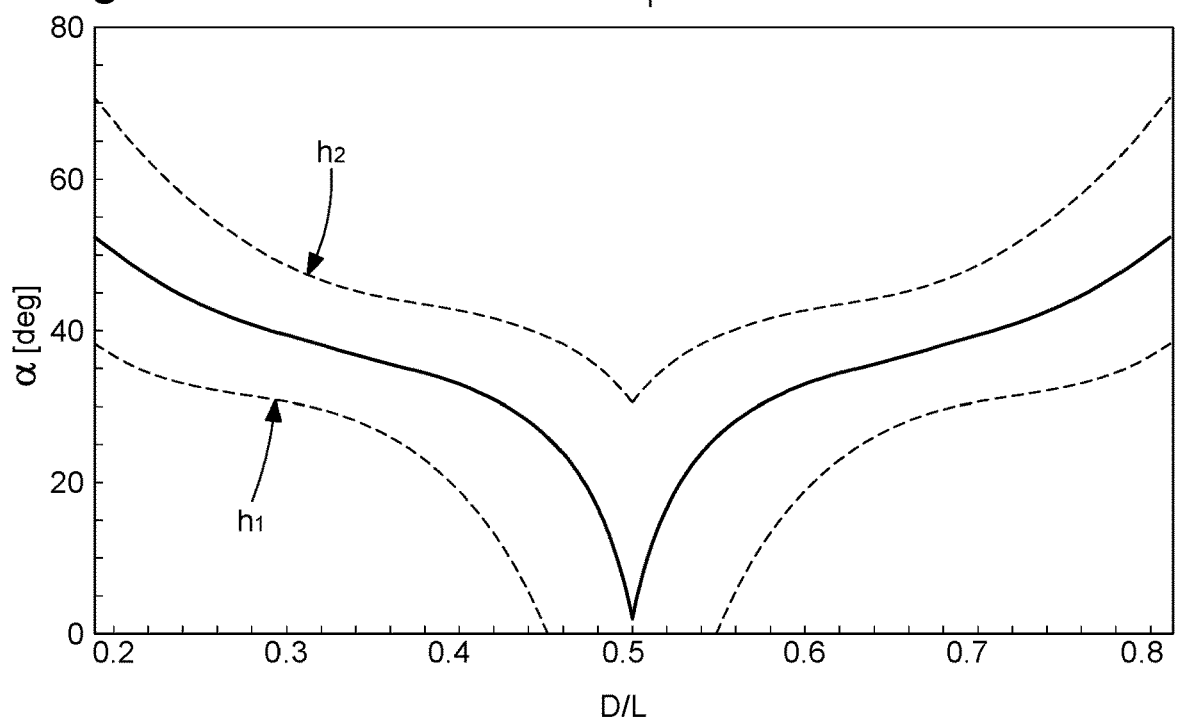
FIG. 5 is a graph with, on the abscissa, ratio X=D/L between, on the one hand, the distance D from the embedding point of a strip in the stationary mass and the crossing point, and on the other hand, the total length L of the same strip between its two opposite embedding points, and on the ordinate, the vertex angle of the crossing point of the flexible strips, and which defines two upper and lower curves, in a dash line, which bound the acceptable domain between these parameters to ensure isochronism. The solid line curve shows an advantageous value.
Figure 9:
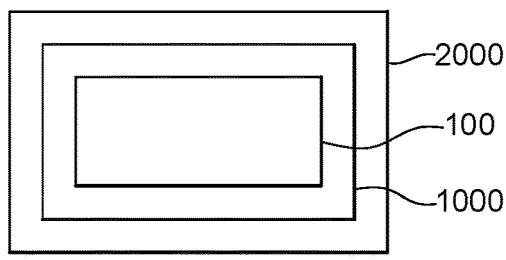
FIG. 9 is a block diagram representing a watch which includes a movement with such a resonator.

More particularly, the embedding point ratio D1/L1, D2/L2, is comprised between 0.15 and 0.49 inclusive, or between 0.51 and 0.85 inclusive, as seen in FIG. 5.

In a variant, and more particularly according to the embodiment of FIG. 5, vertex angle α is less than or equal to 50°, and embedding point ratio D1/L1, D2/L2, is comprised between 0.25 and 0.75 inclusive. In a variant, and more particularly according to the embodiment of FIG. 5, vertex angle α is less than or equal to 40°, and embedding point ratio D1/L1, D2/L2, is comprised between 0.30 and 0.70 inclusive.

In a variant, and more particularly according to the embodiment of FIG. 5, vertex angle α is less than or equal to 35°, and embedding point ratio D1/L1, D2/L2, is comprised between 0.40 and 0.60 inclusive.

Advantageously, and as seen in FIG. 5, vertex angle α and ratio X=D/L satisfy the relation:

$h1(D/L) < \alpha < h2(D/L)$, where, for $0.2 \leq X < 0.5$:

$h1(X) = 116 - 473*(X+0.05) + 3962*(X+0.05)^3 - 6000*(X+0.05)^4$, $h2(X) = 128 - 473*(X-0.05) + 3962*(X-0.05)^3 - 6000*(X-0.05)^4$, for $0.5 < X \leq 0.8$:

$h1(X) = 116 - 473*(1.05-X) + 3962*(1.05-X)^3 6000*(1.05-X)^4$, $h2(X) = 128 - 473*(0.95-X) + 3962*(0.95-X)^3 6000*(0.95-X)^4$.

More particularly, and especially in the non-limiting embodiment illustrated by the Figures, first flexible strips 31 and 32 have the same length L, and the same distance D.

More particularly, between their embedding points, these first flexible strips 31 and 32 are identical.

Figure 6:
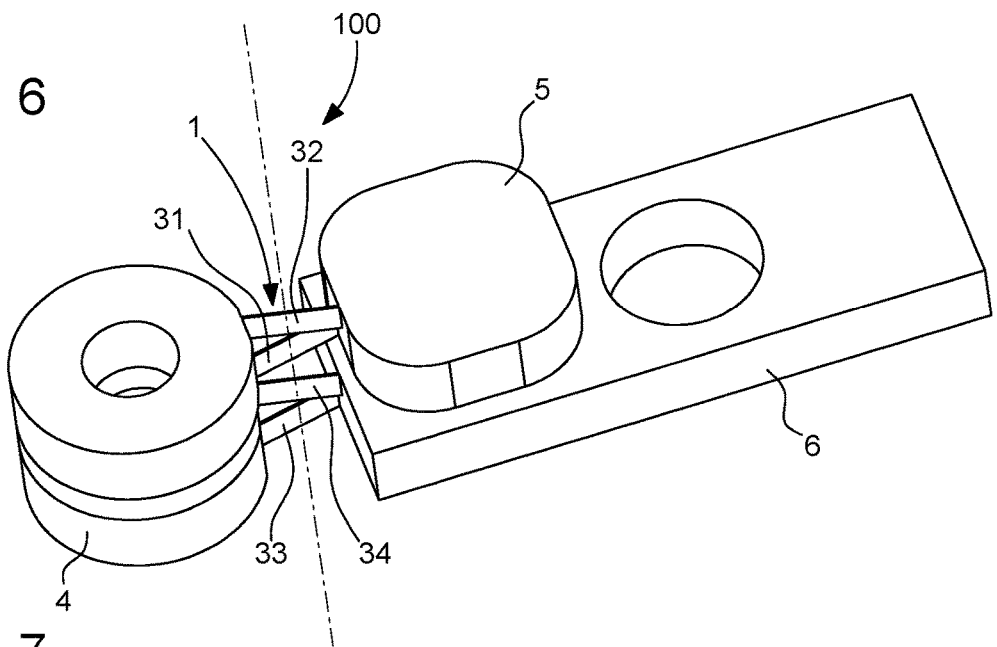
FIG. 6 represents, in a similar manner to FIG. 1, a second variant of the mechanical oscillator, wherein the first rigid support element, of elongated shape, is also movable relative to a stationary structure, and is carried by a third rigid element, by means of a second set of flexible strips, arranged in a similar manner to the first flexible strips, with the second inertial element also being arranged to cooperate with a conventional escapement mechanism (not represented).
Figure 7:
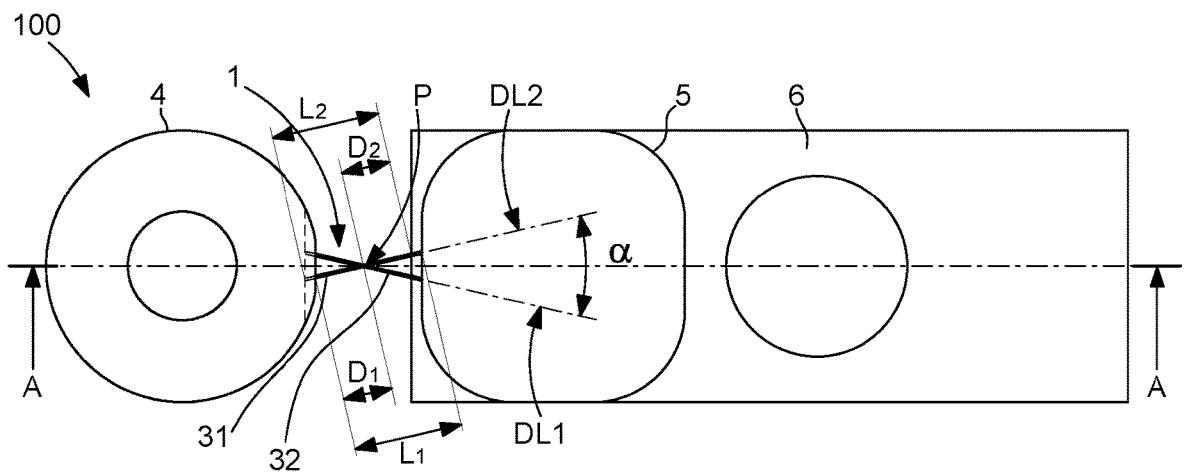
FIG. 7 represents a schematic, plan view of the oscillator of FIG. 6.
Figure 8:
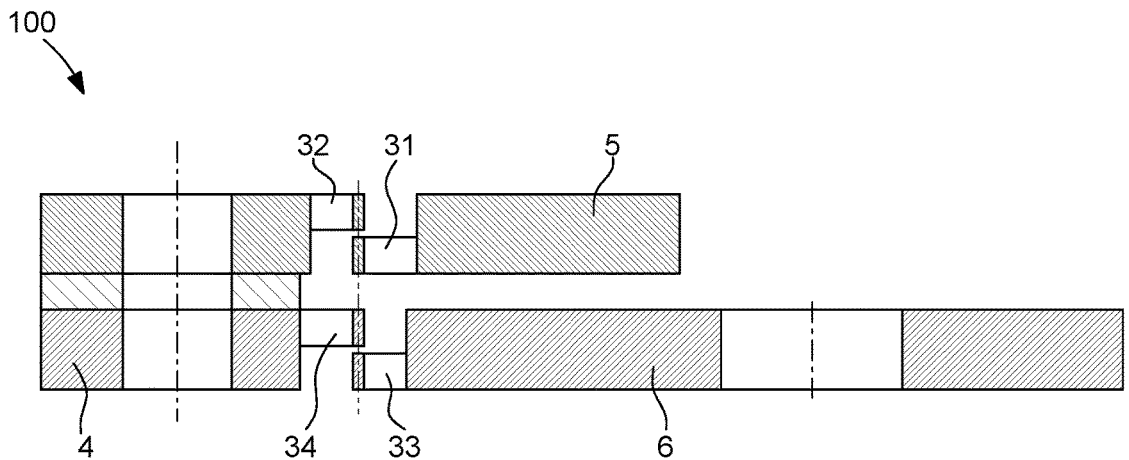
FIG. 8 represents a schematic cross-section through the crossing axis of the strips, of the oscillator of FIG. 1.

FIGS. 6 to 8 illustrate a second variant of mechanical oscillator 100, wherein first rigid support element 4 is also directly or indirectly movable with respect to a stationary structure comprised in oscillator 100, and is carried by a third rigid element 6, by means of two second flexible strips 33, 34, arranged in a similar manner to first flexible strips 31, 32.

More particularly, in the non-limiting embodiment illustrated by the Figures, the projections of first flexible strips 31, 32 and second flexible strips 33, 34 onto the oscillation plane intersect at the same crossing point P.

In another particular embodiment (not represented), in the rest position, in projection onto the oscillation plane, the projections of first flexible strips 31, 32, and of second flexible strips 33, 34, onto the oscillation plane intersect at two distinct points both located on axis of symmetry AA of pivot 1, when pivot 1 is symmetrical with respect to axis of symmetry AA.

More particularly, the embedding points of second flexible strips 33, 34 with first rigid support element 4 and third rigid element 6 define two strip directions that are parallel to the oscillation plane and form between them, in projection onto the oscillation plane, a vertex angle of the same bisector as vertex angle α between the strip directions DL1 and DL2 of first flexible strips 31, 32, in projection onto the oscillation plane. More particularly still, these two directions of second flexible strips 33, 34 have the same vertex angle α as first flexible strips 31, 32.

More particularly, second flexible strips 33, 34 are identical to first flexible strips 31, 32, as in the non-limiting example of the Figures.

More particularly, when pivot 1 is symmetrical with respect to axis of symmetry AA, in the rest position, in projection onto the oscillation plane, the centre of mass of second solid inertial element 5 is located on axis of symmetry AA of pivot 1.

Similarly, and particularly when pivot 1 is symmetrical with respect to axis of symmetry AA, in the rest position, the centre of mass of first rigid support element 4 is located, in projection onto the oscillation plane, on axis of symmetry AA of pivot 1.

In a particular variant, when pivot 1 is symmetrical with respect to axis of symmetry AA, in the rest position, in projection onto the oscillation plane, both the centre of mass of the second solid inertial element 5 and the centre of mass of first rigid support element 4 are located on axis of symmetry AA of pivot 1. More particularly still, the projections of the centre of mass of second solid inertial element 5 and of the centre of mass of first rigid support element 4, on axis of symmetry AA of pivot 1, are coincident.

A particular configuration illustrated by the Figures for such superposed pivots is that wherein the projections of first flexible strips 31, 32 and of second flexible strips 33, 34 onto the oscillation plane intersect at the same crossing point P, which also corresponds to the projection of the centre of mass of second solid inertial element 5, or at least is as close as possible. More particularly, this same point also corresponds to the projection of the centre of mass of first rigid support element 4. More particularly still, this same point also corresponds to the projection of the centre of mass of the entire oscillator 100.

In a particular variant of this superposed pivot configuration, when pivot 1 is symmetrical with respect to axis of symmetry AA, in the rest position, in projection onto the oscillation plane, the centre of mass of second solid inertial element 5 is located on axis of symmetry AA of pivot 1, and at a non-zero distance from the crossing point corresponding to the axis of rotation of second solid inertial element 5, which non-zero distance is comprised between 0.1 times and 0.2 times the total length L of the projection, onto the oscillation plane, of strip 33, 34, with a similar offset to offset ε of FIGS. 2 to 4.

Similarly and particularly when pivot 1 is symmetrical with respect to axis of symmetry AA, the centre of mass of second solid inertial element 5 is located, in projection onto the oscillation plane, on axis of symmetry AA of pivot 1 and at a non-zero distance from the crossing point corresponding to the axis of rotation of first rigid support element 4, which non-zero distance is comprised between 0.1 and 0.2 times the total length L of the projection, onto the oscillation plane, of strip 31, 32.

Similarly, and particularly when pivot 1 is symmetrical with respect to axis of symmetry AA, the centre of mass of first rigid support element 4 is located, in projection onto the oscillation plane, on axis of symmetry AA of pivot 1 and at a non-zero distance from the crossing point P corresponding to the axis of rotation of second solid inertial element 5. In particular, this non-zero distance is comprised between 0.1 times and 0.2 times the total length L of the projection, onto the oscillation plane, of strip 33, 34.

Similarly and particularly when pivot 1 is symmetrical with respect to axis of symmetry AA, the centre of mass of first rigid support element 4 is located, in projection onto the oscillation plane, on axis of symmetry AA of pivot 1 and at a non-zero distance from the crossing point corresponding to the axis of rotation of first rigid support element 4, which non-zero distance is comprised between 0.1 and 0.2 times the total length L of the projection, onto the oscillation plane, of strip 31, 32.

Similarly and particularly, the centre of mass of first rigid support element 4 is located on axis of symmetry AA of pivot 1 and at a non-zero distance from crossing point P which is comprised between 0.1 times and 0.2 times the total length L of the projection onto the oscillation plane of strip 33, 34.

More particularly, and as seen in the variant of the Figures, when pivot 1 is symmetrical with respect to axis of symmetry AA, in projection onto the oscillation plane, the centre of mass of oscillator 100 in its rest position is located on axis of symmetry AA.

More particularly, second solid inertial element 5 is elongated in the direction of axis of symmetry AA of pivot 1, when pivot 1 is symmetrical with respect to axis of symmetry AA. This is, for example, the case of FIGS. 1 to 4, where inertial element 5 includes a base on which is secured a conventional balance with long arms provided with rim sections or inertia blocks in an arc. The objective is to minimise the effect of external angular accelerations about the axis of symmetry of the pivot, since the strips have low rotational stiffness about this axis because of small angle α.

The invention is well suited to a monolithic embodiment of the strips and solid components that they connect, made of micromachinable or at least partially amorphous material, by means of a MEMS or LIGA or similar process. In particular, in the case of a silicon embodiment, oscillator 100 is advantageously temperature compensated by the addition of silicon dioxide to the flexible silicon strips. In a variant, the strips can be assembled, for example, embedded in grooves, or the like.

When there are two pivots in series, as in the case of FIGS. 6 to 9, the centre of mass can be placed on the axis of rotation, in the case where the arrangement is chosen so that undesired movements offset each other, which constitutes an advantageous but non-limiting variant. It should, however, be noted that it is not necessary to choose such an arrangement, and such an oscillator functions with two pivots in series without having to position the centre of mass on the axis of rotation. Of course, although the illustrated embodiments correspond to particular geometric alignment or symmetry configurations, it is clear that it is also possible to place one on top of the other two pivots which are different, or which have different crossing points, or non-aligned centres of mass, or to implement a higher number of sets of strips in series, with intermediate masses to further increase the amplitude of the balance.

In the illustrated variants, all the pivoting axes, strip crossing points, and centres of mass are coplanar, which is a particular, advantageous but non-limiting case.

It is understood that the invention makes it possible to obtain a long angular stroke: in any event greater than 30°, it may reach 50° or even 60°, which makes it compatible in combination with all the usual types of mechanical escapement—Swiss lever, detent, coaxial or other.

The invention concerns a timepiece movement 1000 including at least one such mechanical oscillator 100.

The invention also concerns a watch 2000 including at least one such timepiece movement 1000.

What is claimed is:

1. A mechanical timepiece oscillator comprising:
   a first rigid support element;
   a solid inertial element; and
   at least two first flexible strips between said first rigid support element and said solid inertial element, the at least two first flexible strips support said solid inertial element and are arranged to return the solid inertial element to a rest position,
   wherein said solid inertial element is arranged to oscillate anallarly in an oscillation plane about said rest position,
   wherein said two first flexible strips do not touch each other and their projections onto said oscillation plane intersect, in the rest position, at a crossing point, through which passes the axis of rotation of said solid inertial element perpendicularly to said oscillation plane, and
   wherein embedding points of said first flexible strips in said first rigid support element and said solid inertial element define two strip directions, which are parallel to said oscillation plane and which form between them, in the rest position, in projection onto said oscillation plane, a vertex angle, the position of said crossing point being defined by a ratio X=D/L, where D is a distance between the projection onto said oscillation plane of one of the embedding points of said first strips in said first rigid support element and said crossing point, and where L is a total length of the projection, onto said oscillation plane, of said strip, where a value of said ratio D/L is comprised between 0 and 1, wherein said vertex angle (a) is less than or equal to 60°, and wherein, for each said first flexible strip, the embedding point ratio is comprised between 0.15 and 0.85 inclusive.

2. The mechanical oscillator according to claim 1, wherein the centre of mass of said oscillator in its rest position is separated from said crossing point by an offset which is comprised between 10% and 20% of said total length of the projection, onto said oscillation plane, of said strip.

3. The mechanical oscillator according to claim 2, wherein said offset is comprised between 12% and 18% of said total length of the projection, onto said oscillation plane, of said strip.

4. The mechanical oscillator according to claim 1, wherein said first strips and their embedding points define together a pivot which, in projection onto said oscillation plane, is symmetrical with respect to an axis of symmetry passing through said crossing point.

5. The mechanical oscillator according to claim 4, wherein, in the rest position, in projection onto said oscillation plane, the centre of mass of said solid inertial element is located on said axis of symmetry of said pivot.

6. The mechanical oscillator according to claim 5, wherein, in projection onto said oscillation plane, the centre of mass of said solid inertial element is at a non-zero distance from said crossing point corresponding to the axis of rotation of said solid inertial element, which non-zero distance is comprised between 0.1 times and 0.2 times the total length of the projection, onto said oscillation plane, of said strip.

7. The mechanical oscillator according to claim 1, wherein said first strips are straight strips.

8. The mechanical oscillator according to claim 1, wherein said embedding point ratio is comprised between 0.15 and 0.49 inclusive, or between 0.51 and 0.85 inclusive.

9. The mechanical oscillator according to claim 8, wherein said vertex angle (a) is less than or equal to 50°, and wherein said embedding ratio is comprised between 0.25 and 0.75 inclusive.

10. The mechanical oscillator according to claim 9, wherein said vertex angle is less than or equal to 40°, and wherein said embedding point ratio is comprised between 0.30 and 0.70 inclusive.

11. The mechanical oscillator according to claim 10, wherein said vertex angle is less than or equal to 35°, and wherein said embedding point ratio is comprised between 0.40 and 0.60 inclusive.

12. The mechanical oscillator according to claim 1, wherein said vertex angle is less than or equal to 30'.

13. The mechanical oscillator according to claim 1, wherein said apex angle and said ratio X=D/L satisfy the relation $h1(D/L)<\alpha<h2(D/L)$, where, for $0.2<X<0.5$:

$$h1(X)=116-473*(X+0.05)+3962*(X+0,05)^3-6000*(X+0.05)^4,$$

$$h2(X)=128-473*(X-0.05)+3962*(X-0.05)^3-6000*(X-0.05)^4,$$

for $0.5<X<0.8$:

$$h1(X)=116-473*(1.05-X)+3962*(1.05-X)^3-6000*(1.05-X)^4,$$

$$h2(X)=128-473*(0.95-X)+3962*(0.95-X)^3-6000*(0.95-X)^4.$$

14. The mechanical oscillator according to claim 1, wherein said first flexible strips have the same length L and the same distance D.

15. The mechanical oscillator according to claim 14, wherein, between their embedding points, said first flexible strips are identical.

16. The mechanical oscillator according to claim 1, wherein said first rigid support element is also directly or indirectly movable with respect to a stationary structure comprised in said oscillator, and is carried by a third rigid element, by means of two second flexible strips arranged in a similar manner to said first flexible strips.

17. The mechanical oscillator according to claim 16, wherein the projections of said first flexible strips and of said second flexible strips onto said oscillation plane intersect at the same said crossing point.

18. The mechanical oscillator according to claim 16, wherein said first strips and their embedding points define together a pivot which, in projection onto said oscillation plane, is symmetrical with respect to an axis of symmetry passing through said crossing point, and wherein, in the rest position, in projection onto said oscillation plane, the projections of said first flexible strips and of said second flexible strips onto said oscillation plane intersect at two distinct points both located on said axis of symmetry of said pivot.

19. The mechanical oscillator according to claim 16, wherein the embedding points of said second flexible strips in said first rigid support element and said third rigid element define two strip directions that are parallel to said oscillation plane and form between them, in projection onto said oscillation plane, the same said vertex angle as said first, flexible strips.

20. The mechanical oscillator according to claim 16, wherein said second flexible strips are identical to said first flexible strips.

21. The mechanical oscillator according to claim 16, wherein said first strips and their embedding points define together a pivot which, in projection onto said oscillation plane, is symmetrical with respect to an axis of symmetry passing through said crossing point, and wherein, in the rest position, in projection onto said oscillation plane, the centre of mass of said solid inertial element is located on said axis of symmetry of said pivot.

22. The mechanical oscillator according to claim 17, wherein said first strips and their embedding points define together a pivot which, in projection onto said oscillation plane, is symmetrical with respect to an axis of symmetry passing through said crossing point, and wherein, in the rest position, in projection onto said oscillation plane, the centre of mass of said solid inertial element is located on said axis of symmetry of said pivot, and wherein, in the rest position, the projections of said first flexible strips and of said second flexible strips onto the oscillation plane intersect at the same crossing point, which also corresponds to the projection of the centre of mass of said solid inertial element.

23. The mechanical oscillator according to claim 4, wherein said centre of mass of said oscillator in its rest position is located on said axis of symmetry.

24. The mechanical oscillator according to claim 1, wherein said solid inertial element is elongated in the direction of the axis of symmetry of said pivot.

25. A timepiece movement including at least one of said mechanical oscillator according to claim 1.

26. A watch including at least one of said timepiece movement according to claim 25.

* * * * *